US005717704A

United States Patent [19]
Rosenfeld

[11] Patent Number: 5,717,704
[45] Date of Patent: Feb. 10, 1998

[54] TEST SYSTEM INCLUDING A LOCAL TRIGGER SIGNAL GENERATOR FOR EACH OF A PLURALITY OF TEST INSTRUMENTS

[75] Inventor: Eric H. Rosenfeld, Ashland, Mass.

[73] Assignee: LTX Corporation, Westwood, Mass.

[21] Appl. No.: 633,172

[22] Filed: Apr. 16, 1996

[51] Int. Cl.[6] .......................... G01R 31/28; G11C 29/00
[52] U.S. Cl. ...................... 371/25.1; 371/20.1; 371/21.1; 371/22.1
[58] Field of Search .................... 371/25.1, 20.1, 371/21.1, 21.2, 22.1; 324/158.1, 158 R, 73.1, 750

[56] References Cited

U.S. PATENT DOCUMENTS

| | | | |
|---|---|---|---|
| 5,027,297 | 6/1991 | Garitty et al. | 364/569 |
| 5,289,116 | 2/1994 | Kurita et al. | 324/158 R |
| 5,341,091 | 8/1994 | Kurita | 324/750 |
| 5,583,430 | 12/1996 | Dinteman | 324/158.1 |
| 5,619,158 | 4/1997 | Casal et al. | 327/292 |

*Primary Examiner*—Hoa T. Nguyen
*Attorney, Agent, or Firm*—Lappin & Kusmer LLP

[57] ABSTRACT

A local trigger signal generator is provided for each of a plurality of test instruments in a test system. The disclosed test system includes a master clock generator that defines a start time $t_0$ and generates a periodic master clock signal characterized by a master clock oscillation frequency $f_{mc}$ and a corresponding period $T_{mc}$. The master clock generator generates a clock network signal that is representative of the master clock signal and the start time $t_0$. The system further includes a set of n test instruments TIN1, TIN2, ... TINn. An ith one of the test instruments TINi includes a local clock receiver for receiving the clock network signal and defining therefrom a local start time $t_0i$ and for generating therefrom a local timestamp signal LTSSi, where the local timestamp signal LTSSi is representative of a number of time intervals having a length substantially equal to the period $T_{mc}$ occurring after the local start time $t_0i$. The ith test instrument also stores one or more local trigger values and generates one or more local trigger signals LTGSi when the local timestamp signal LTSSi equals one or more of the local trigger values.

33 Claims, 6 Drawing Sheets

TEST SYSTEM INCLUDING A LOCAL TRIGGER SIGNAL GENERATOR FOR EACH OF A PLURALITY OF TEST INSTRUMENTS

CROSS-REFERENCE TO RELATED APPLICATIONS

This application is related to U.S. patent application No. 08/633,071, entitled Improved Differential Time Interpolator, (Attorney Docket No. LTXL-110) assigned to the present assignee, and filed concurrently with the present application.

BACKGROUND OF THE DISCLOSURE

The present invention relates to systems for testing an electronic device or system, referred to below as a Device Under Test (DUT). More specifically, the invention relates to test systems having improved timing characteristics.

As is well known, systems or equipment, for testing DUTs are widely used in the manufacture of electronic products. For example, semiconductor manufacturers use test systems to test virtually all types of integrated circuits (ICs), including digital ICs, linear or analog ICs, as well as mixed signal ICs (a mixed signal IC being of the type that includes both digital and linear components).

During the design phase of an IC, test equipment is used for design verification, characterization, qualification and failure analysis. During manufacture, test equipment is used during wafer probing to select usable ICs and after packaging to classify ICs by performance characteristics and to determine conformance with quality standards. Typically, all ICs are tested two or more times during the manufacturing process. In addition, many large electronic equipment manufacturers employ test equipment for incoming inspection and for further classification of ICs.

Figure 1:
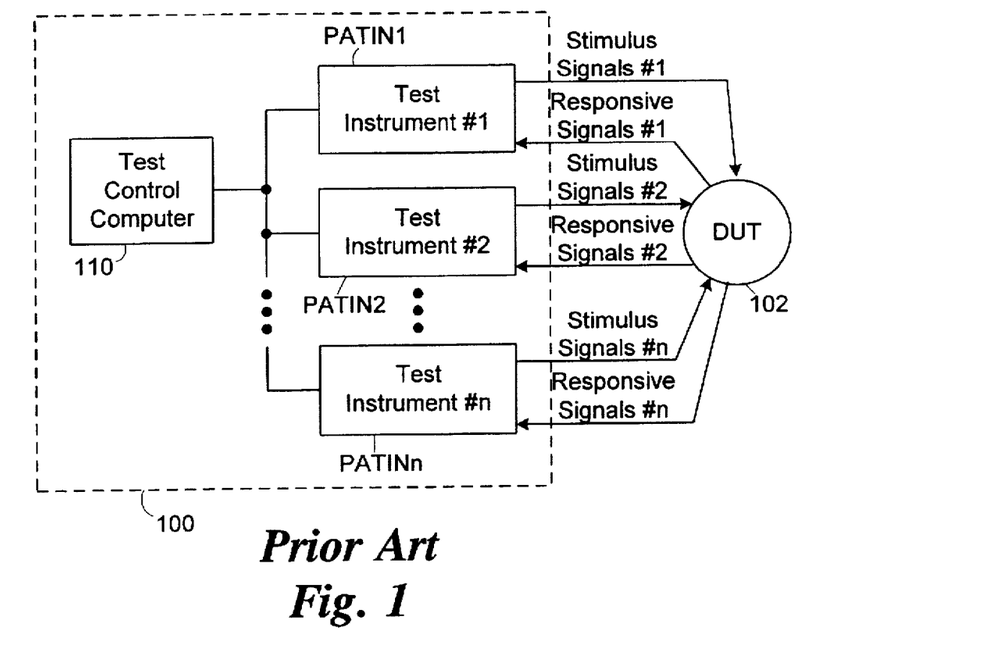
FIG. 1 shows a block diagram of a prior art test system.

FIG. 1 shows a block diagram of a prior art test system 100 that is connected to a DUT 102 for testing that DUT. System 100 includes a central test control computer 110 and a set of n prior art test instruments PATIN1–PATINn. Test control computer 110 is coupled to and controls each of the test instruments. Each of the test instruments generates and applies one or more stimulus signals to DUT 102 and/or each of the test instruments receives one or more responsive signals generated by the DUT 102.

In operation, test system 100 applies a set of preprogrammed stimulus signals to DUT 102 and evaluates the performance of the DUT by analyzing the responsive signals generated by the DUT in response to the preprogrammed stimulus signals. Each of the test instruments may be thought of as including a stimulus portion (not shown) for generating the stimulus signals and applying them to DUT 102, and a measurement portion (not shown) for receiving and measuring the responsive signals generated by DUT 102 and for comparing the measured responsive signals with a set of expected values.

Early versions of prior art system 100 were developed in the 1960s, and in those early versions test control computer 110 controlled the operation of each of the test instruments PATIN1–PATINn by directly controlling the state of the internal data registers and components of the test instruments. To test DUT 102, an operator would write a test program that specified the internal state of all the test instruments PATIN1–PATINn for every portion of the test, and test control computer 110 would then execute the test program. In these early versions, the actual timing of stimulus signals received at DUT 102 depended on the operation speed of the test control computer 110, the speed of the test instruments, and the propagation delays between the test instruments and the DUT. Since, in general, these timing characteristics could not be specified, early versions of system 100 could not explicitly control the timing of stimulus signals applied to DUT 102 in the time frame of the DUT, and similarly could not measure responsive signals in the time frame of the DUT. Early versions of system 100 could therefore test only limited attributes of the DUT. Further, early versions of test system 100 did not provide accurate control over the test parameters, such as voltage and current, of stimulus signals applied to the DUT and also did not accurately measure such parameters of responsive signals generated by the DUT.

Later developed versions of system 100 provided some ability to test DUT 102 in the time frame of the DUT. For example, in some digital test systems in which the propagation delays between the DUT and the test instruments were larger than the rated timing accuracy of the system, the stimulus portions of the test instruments were designed to anticipate when a given stimulus signal would be required at the DUT and to generate the stimulus signal early so that it would arrive at the DUT at the proper time. Similarly, the measurement portion of the test instruments would delay measurements of the responsive signals to account for propagation delays between the DUT and the test instruments. Such test systems provided independent timing control of signals applied to and measured from different input/Output pins of the DUT. This independent timing control was achieved by including signal specific components, such as fixed pipeline delays, in the various test instruments. So these test systems were specifically tailored to test a particular class of DUTs and did not provide a generalized architecture capable of providing independent timing control to an arbitrary DUT requiring new signal types.

Other versions of test system 100 provided for control of the voltage and the current of stimulus signals applied to the DUT and also provided accurate measurements of these parameters of responsive signals generated by the DUT. To accomplish this, test control computer 110 transmitted a different calibration value, or a different set of calibration coefficients, to each of the test instruments and these calibration coefficients accounted for factors such as losses and resistances in the connections between the test instruments and the DUT. The calibration coefficients were typically measured using specifically designed calibration programs.

Figure 2:
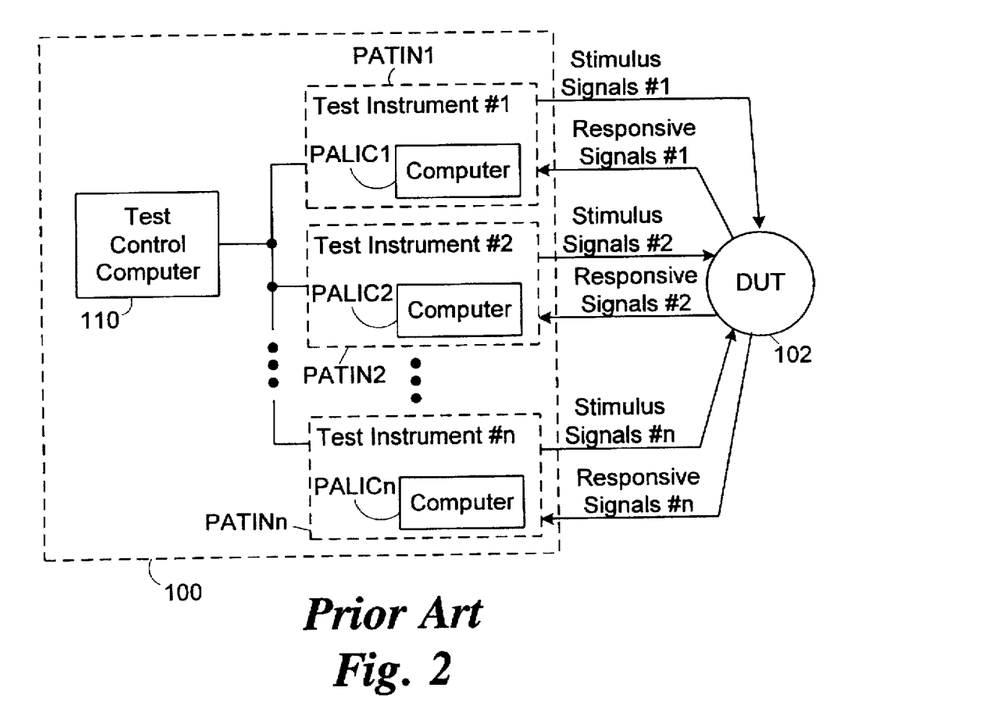
FIG. 2 shows a block diagram of another version of the prior art test system shown in FIG. 1.

FIG. 2 shows a block diagram of a version of prior art test system 100 that was developed in the 1980s and in which some or all of the prior art test instruments PATIN1–PATINn include a prior art local instrument controller (sometimes referred to as a satellite computer) PALIC. Including a local instrument controller in each test instrument provided several advantages including simplification of the test programs executed by test control computer 110. The local instrument controller in each test instrument controlled the detailed internal operation of the test instrument, and this allowed test control computer 110 to control each test instrument via higher level commands. For example, the local instrument controllers calculated and stored any necessary calibration coefficients, and the test control computer 110 specified the parameters of a signal in terms of standard engineering units (e.g., Volts or Amps).

Test systems of the type shown in FIG. 2 also employed a mechanism commonly referred to as "stored states" which further simplified the operation of the system 100. In a test system 100 employing stored states, each local instrument controller included a state memory (not shown) for recording or storing the detailed internal state of its test instrument. Once a test instrument had been configured for a particular test operation, the state of all the internal registers and devices of the instrument could be stored in the state memory, and then at a later time the test instrument could be quickly reconfigured for that test operation simply by using the state memory to restore the state of the test instrument. The state memory was typically designed so that it could store many different configurations of its test instrument and each configuration would be associated with a different test operation. The test control computer 110 could then configure all the test instruments in parallel for a given test operation simply by accessing the proper memory locations in each test instrument's state memory, and this greatly reduced the time required to prepare the test system 100 for a given test operation.

U.S. Pat. No. 5,293,374, granted to Edison on Mar. 8, 1994, (hereinafter, the "Edison Patent") discloses a test system of the type shown in FIG. 2. In that system, each of the test instruments includes a real time clock (not shown). The test control computer (or "coordinator" as it is referred to in the Edison Patent) 110 issues commands to each of the test instruments, and the test instruments execute these commands at appropriate times as measured by their own local real time clocks. One problem with this system is that the real time clocks on the various instruments may drift over time and thereby disturb the overall timing synchronization of the system. Further, this system does not provide the ability to generate or measure signals in the time frame of the DUT or exact frequency synchronization between instruments.

It is therefore an object of the invention to provide a test system having improved timing characteristics in which the time reference signals on the various test instruments do not drift over time with respect to one another.

Other objects and advantages of the present invention will become apparent upon consideration of the appended drawings and description thereof.

SUMMARY OF THE INVENTION

The foregoing and other objects are achieved by the invention which in one aspect comprises a test system for testing a DUT. The system includes a master clock generator that defines a start time to and generates a periodic master clock signal characterized by a master clock oscillation frequency $f_{mc}$ and a corresponding period $T_{mc}$. The master clock generator generates a clock network signal that is representative of the master clock signal and the start time to. The system further includes a set of n test instruments TIN1, TIN2, . . . TINn. An ith one of the test instruments TINi includes a local clock receiver for receiving the clock network signal and defining therefrom a local start time $t_0i$ and for generating therefrom a local timestamp signal LTSSi, where the local timestamp signal LTSSi is representative of a number of time intervals having a length substantially equal to the period $T_{mc}$ occurring after the local start time $t_0i$. The ith test instrument also stores one or more local trigger values and generates one or more local trigger signals LTGSi when the local timestamp signal LTSSi equals one or more of the local trigger values.

The master clock generator may generate a start signal representative of the start time $t_0$. The clock network signal may include both the master clock signal and the start signal. The master clock generator may include a modulator for generating a modulated signal by modulating the start signal onto the master clock signal and the clock network signal may comprise the modulated signal. The master clock generator may also include a counter for generating a master timestamp signal representative of the number of periods $T_{mc}$ of the master clock signal following the start time to and the clock network signal may comprise the master timestamp signal.

The system may include a clock distribution network for distributing the clock network signal to the test instruments, and the clock distribution network may be a homogeneous or a non-homogeneous network.

In one form of the invention, at least one of the test instruments or the test controller includes a local event message generator for generating event messages. Each event message may be representative of the occurrence of a particular event, and also of the occurrence time of the particular event. One or more of the test instruments may include a local event receiver for receiving event messages and may also include devices for generating one or more local trigger signals in response to event messages.

The system may include an event message network for receiving event messages from a test instrument or test controller and for distributing the event messages to other test instruments. The event message network may be a homogeneous network or a non-homogeneous network.

The system may also include a shared event coordinator for receiving event messages and for generating an event message in response to the occurrence of a set or sequence of event messages.

One or more of the test instruments may include devices for generating a stimulus signal and for applying the stimulus signal to the DUT in response to a local trigger signal. One or more of the test instruments may include devices for measuring a responsive signal generated by the DUT in response to a local trigger signal.

One or more of the test instruments may include a time interpolator for receiving a local timestamp signal and for generating therefrom an improved resolution local timestamp signal. The local trigger generator may generate one or more local trigger signals when the improved resolution timestamp signal equals one or more of the local trigger values.

BRIEF DESCRIPTION OF DRAWINGS

The foregoing and other objects of this invention, the various features thereof, as well as the invention itself, may be more fully understood from the following description, when read together with the accompanying drawings in which.

Like numbered elements in each FIGURE represent the same or similar elements.

DESCRIPTION OF THE PREFERRED EMBODIMENTS

Figure 3:
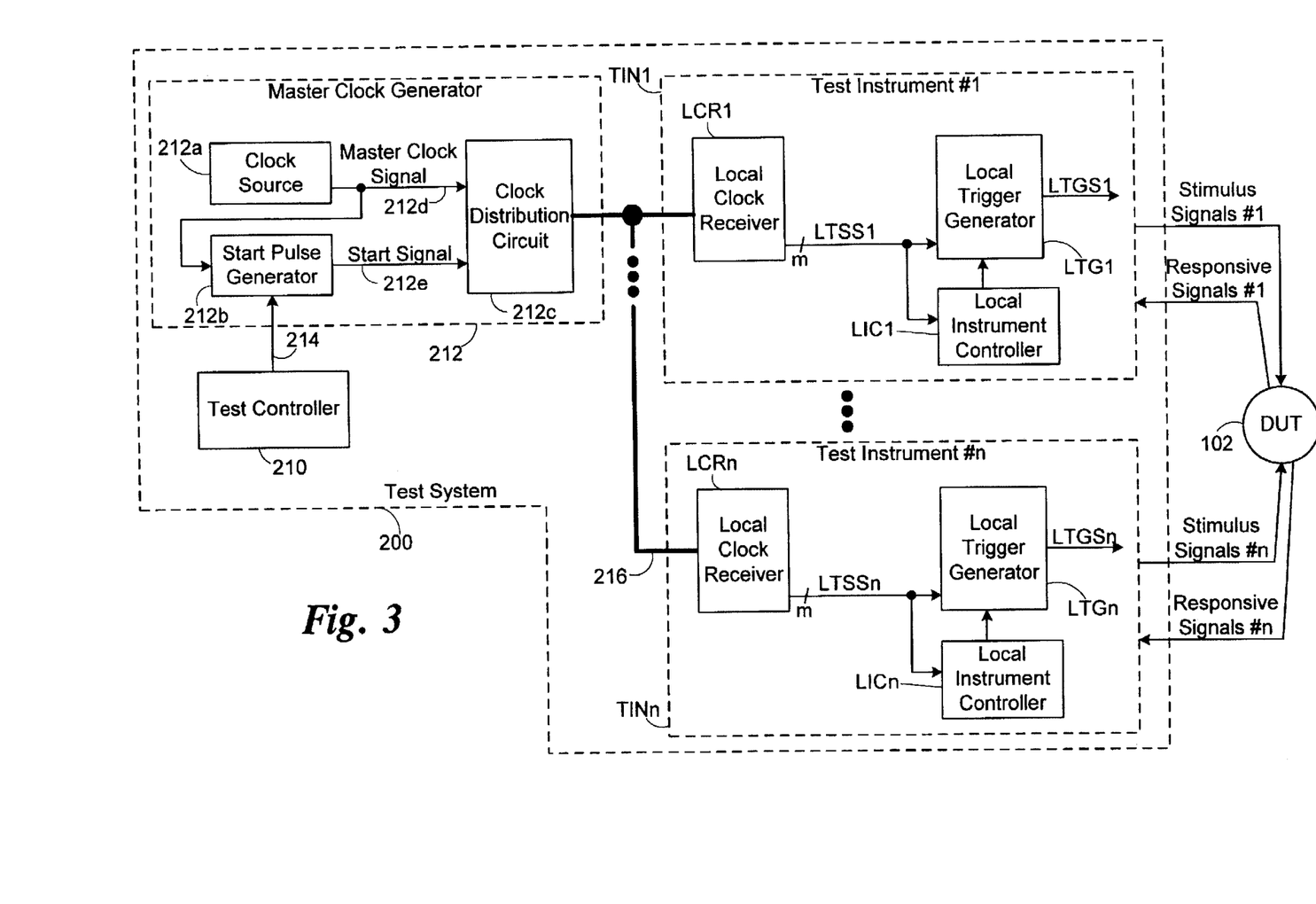
FIG. 3 shows a block diagram of one embodiment of a test system constructed according to the invention.

FIG. 3 shows a block diagram of one embodiment of an improved test system 200 constructed according to the invention that is useful for testing DUT 102. Test system 200 includes a test controller 210, a master clock generator 212, and a set of n test instruments TIN1–TINn. Test controller 210 is coupled to master clock generator 212 via a line 214, and master clock generator 212 is coupled to each of the test instruments TIN1–TINn via a clock distribution network 216. Each of the test instruments TIN1–TINn is coupled to DUT 102 and may apply one or more stimulus signals to the DUT and may receive one or more responsive signals generated by the DUT. Master clock generator 212 includes a clock source, such as an oscillator, 212a, a start pulse generator 212b, and a clock distribution circuit 212c. Clock source 212a generates a master clock signal and applies the master clock signal via line 212d (as used herein, the term "line" refers to any type of signal path, e.g., wire, cable, fiber optic cable, etc.) to clock distribution circuit 212c and to start pulse generator 212b. The start pulse generator 212b generates a start signal in response to a signal received via line 214 from test controller 210, and the start signal is applied via line 212e to clock distribution circuit 212c. Clock distribution circuit 212c applies the master clock and start signals, or signals generated therefrom, via clock distribution network 216 to all of the test instruments TIN1–TINn. In system 200, all of the test instruments TIN1–TINn receive the master clock and start signals, or signals generated therefrom, from master clock generator 212, however, those skilled in the art will appreciate that the invention embraces systems including additional test instruments that do not receive these signals and operate asynchronously with respect to master clock generator 212.

In operation, clock source 212a generates the master clock signal so that it is a periodic signal that is characterized by a selected master clock frequency $f_{mc}$ and a corresponding period $T_{mc}$. As those skilled in the art will appreciate, it is often advantageous to select the frequency $f_{mc}$ of the master clock signal so that it is an integer multiple of a clock frequency of the DUT. Therefore, the clock source 212a in the master clock generator 212 preferably permits the frequency $f_{mc}$ of the master clock signal to be selected from a range of frequencies.

An ith one of the test instruments TINi includes a local clock receiver LCRi, a local instrument controller LICi, and a local trigger generator LTGi, for all i from one to n. All the local clock receivers LCR1–LCRn are coupled to the clock distribution network 216. The ith local clock receiver LCRi generates an m-bit local timestamp signal LTSSi. It may also generate one or more periodic local clock signals (not shown). The local timestamp signal and the local clock signals (if generated) are used internally in the ith test instrument TINi for all i from one to n. The local timestamp signal LTSSi in the ith test instrument TINi is applied to the local trigger generator LTGi, and the local instrument controller LICi, for all i from one to n. The local instrument controller LICi generates a local control signal that is applied to the local trigger generator LTGi, for all i from one to n. The local trigger generator LTGi generates one or more local trigger signals LTGSi which are used internally in the ith test instrument, for all i from one to n.

In operation of system 200, the start pulse generator 212b uses the start signal to define an initial time to and thereby provides system 200 with an initial timing reference. Start pulse generator 212b generates the start signal so that it identifies a particular transition (e.g., a "rising" or a "falling" edge transition) of the master clock signal, and this transition is then considered by system 200 to have occurred at time t0. Start pulse generator 212b may generate the star signal so that it is a pulse that straddles a single transition of the master clock signal and thereby identifies that transition as the one occurring at time $t_0$, although of course other versions of the start signal may also be used. Time to then defines the "start of testing" for a particular test or test program executed by system 200.

All of the local clock receivers LCR1–LCRn receive the master clock signal and the start signal (or signals generated therefrom) via the clock distribution network 216 and generate therefrom their respective local timestamp signals LTSS1–LTSSn. An ith one of the local clock receivers defines a local start time $t_0i$ and generates its local timestamp signal LTSSi so that it is representative of the number of time intervals of length $T_{mc}$ that have occurred since the local start time $t_0i$, for all i from one to n. As will be discussed in greater detail below, generating the local timestamp signals in this fashion provides an improved level of timing synchronization to system 200. The local clock receivers may generate their local clock signals (not shown) in response to the master clock signal so that the frequency of each local clock signal is related to that of the master clock signal or alternatively, the local clock signals (not shown) may be generated independently of the master clock signal.

As those skilled in the art will appreciate, there are many different embodiments of the master clock generator 212, the clock distribution network 216, and the local clock receivers LRC1–LCRn, that permit generation of the local timestamp signals in this fashion, and all of these various embodiments are embraced by the invention. For example, the clock distribution network 216 may be implemented using any medium suitable for transmitting clock signals such as, for example, wire, wireless, cable, printed circuit, optical, fiber optic, infrared, and waveguide mediums. Further, the clock distribution network 216 may be a homogenous network meaning that substantially the entire clock distribution network 216 is implemented using a single type of medium (e.g., wire), or alternatively the clock distribution network 216 may be a non-homogenous network so that one portion of the clock distribution network 216 may be implemented using one type of medium (e.g., fiber optic cable) and another portion of the clock distribution network 216 may be implemented using another type of medium (e.g., coaxial cable).

Figure 4A:
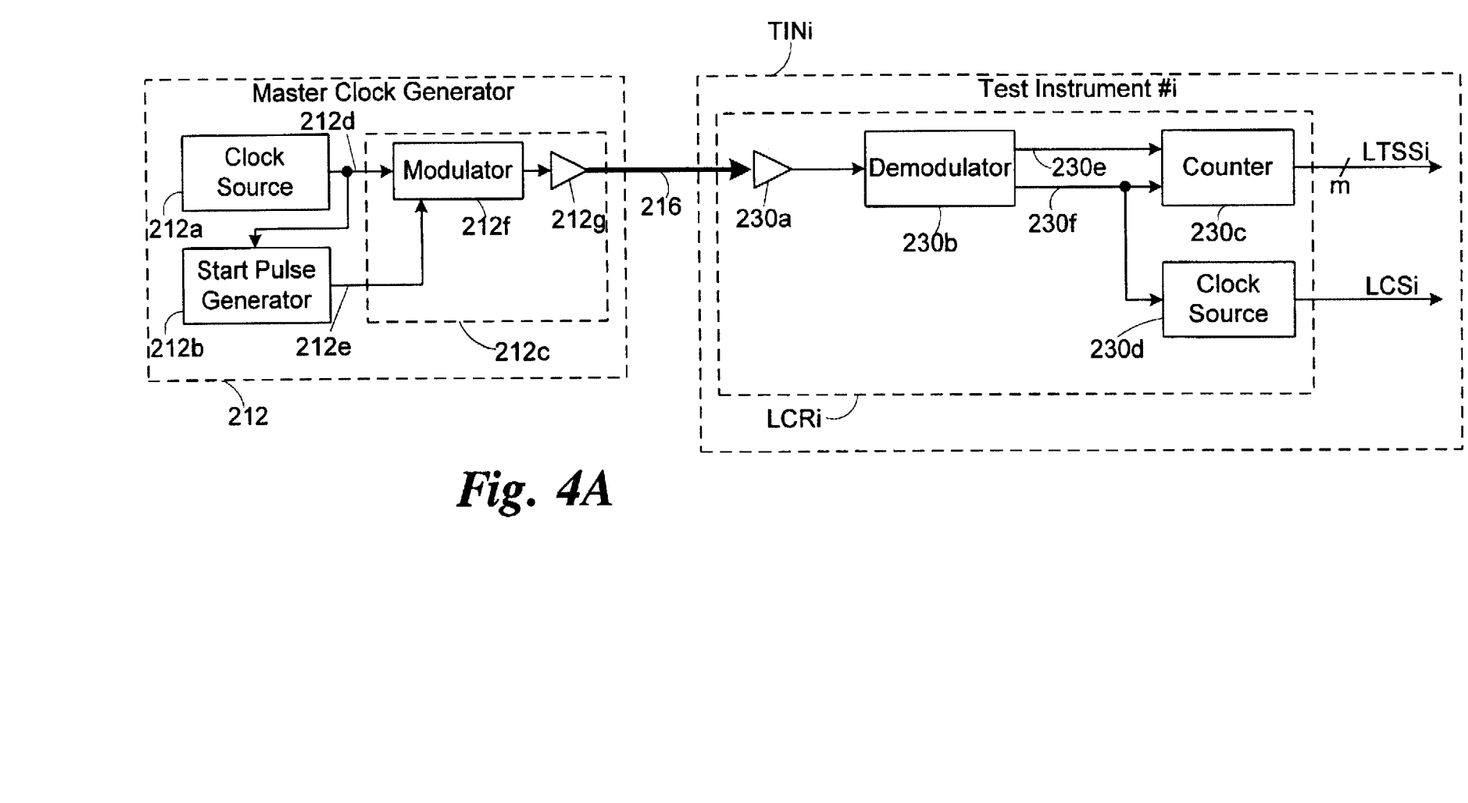
FIGS. 4A-4C show block diagrams of three different embodiments of the master clock generator and the local clock receivers shown in FIG. 3.
Figure 4B:
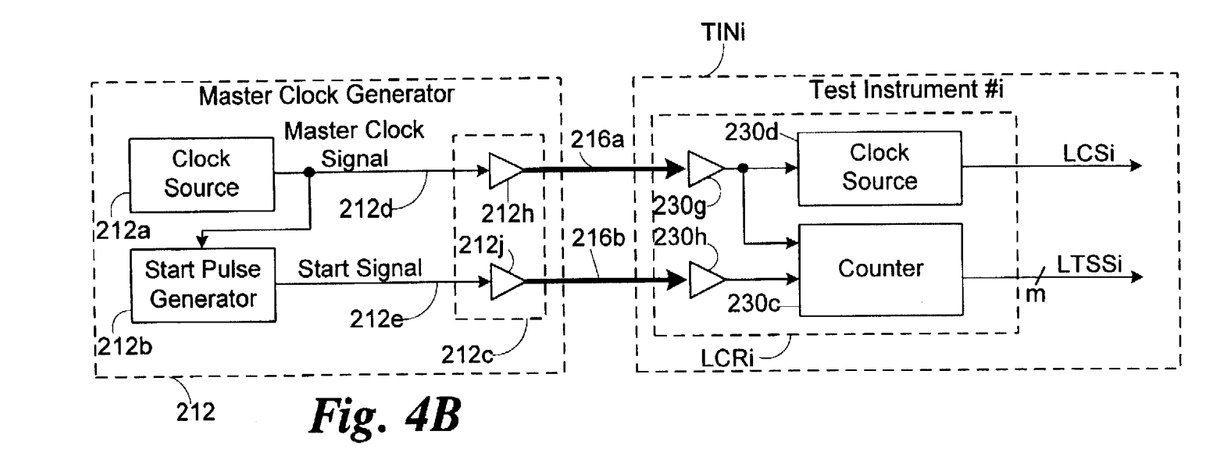
Figure 4C:
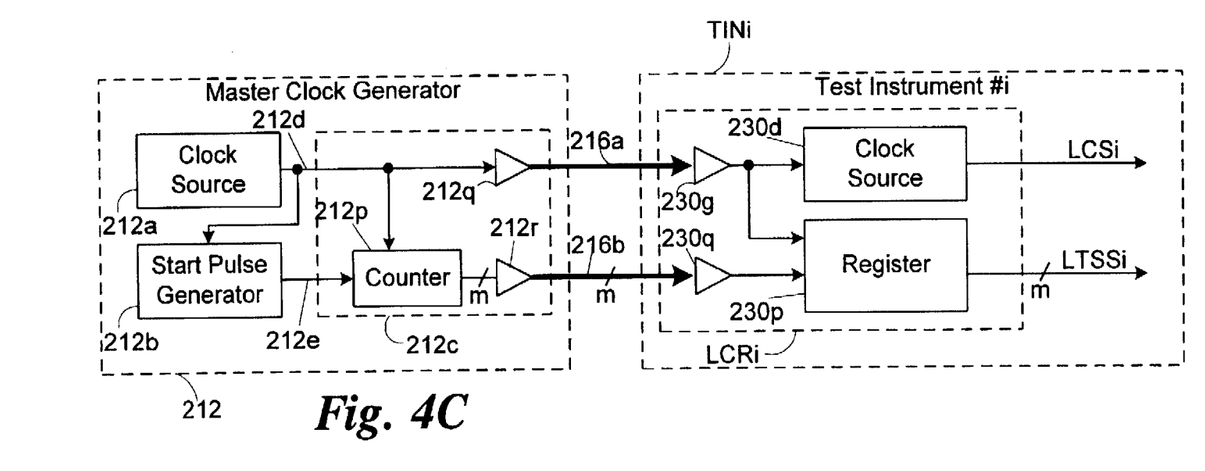

FIGS. 4A–4C show, by way of example, block diagrams of three different embodiments of the master clock generator 212 and the ith local clock receiver LCRi in the ith test instrument TINi, all of which are constructed according to the invention. In the embodiment shown in FIG. 4A, clock distribution circuit 212c includes a modulator 212f and a buffer 212g, and the local clock receiver LCRi includes a buffer 230a, a demodulator 230b, a counter 230c, and a clock source 230d. In the master clock generator 212, the master clock and start signals are applied via lines 212d and 212e, respectively, to modulator 212f which generates therefrom a modulated signal that is applied to buffer 212g. The latter receives the modulated signal and generates therefrom an output signal that is applied to clock distribution network 216. In the local clock receiver LCRi, the buffer 230a receives a signal from the clock distribution network 216 and generates therefrom an output signal that is applied to demodulator 230b which generates therefrom two output signals on lines 230e and 230f. Both of the output signals generated by demodulator 230b are applied to counter 230c, which generates therefrom the local timestamp signal LTSSi, and the output signal on line 230f is also applied to clock source 230d which generates therefrom one or more local clock signals LCSi.

In operation, modulator 212f uses a modulation technique, such as any one of the many known modulation techniques, to modulate the start signal onto the master clock signal and thereby generates the modulated signal. Buffer 212g receives the modulated signal and generates therefrom an output signal that is representative of the modulated signal and applies this signal to the clock distribution network 216. After an associated propagation delay, clock distribution network 216 applies a signal representative of the modulated signal to buffer 230a which in turn generates an output signal that is also representative of the modulated signal. Demodulator 230b receives and demodulates this signal and thereby generates an output signal on line 230e that is representative of the start signal (after being delayed by an associated propagation delay) and another output signal on line 230f that is representative of the master clock signal (after being delayed by an associated propagation delay). The signal on line 230e (which is representative of the start signal) is applied to an enabling input (such as an enable, load, or reset input) of counter 230c and thereby resets, or initializes, the counter at a time $t_0i$ that is shortly after the initial time to so that the time $t_0i$ is the local start time for the ith test instrument. The signal on line 230f (which is representative of the master clock signal) is applied to a clock input of counter 230c and counter 230c counts the number of periods of the signal on line 230f following the local start time $t_0i$ and thereby generates the local timestamp signal LTSSi. Clock source 230c receives the signal on line 230f and generates therefrom the local clock signals LCSi.

The operation of buffers 212g and 230a depends on the nature of the section of the clock distribution network 216 that couples them together. For example, if the clock distribution network 216 is simply implemented using a wire, then buffers 212g, 230a may be implemented using simple amplifying buffers, or alternatively, buffers 212g, 230a may be eliminated from system 200. Alternatively, if clock distribution network 216 is implemented using fiber optic cables, the buffers 212g and 230a are preferably implemented using appropriate electro-optical converters (e.g., buffer 212g may be implemented as a light emitting diode (LED) that converts an electrical signal to an optical signal, and buffer 230a may be implemented as a photosensitive cell that converts an optical signal to an electrical signal). In any case, the buffers 212g and 230a are implemented as devices that provide an appropriate form of signal conversion and/or amplification. Further, master clock generator 212 may include one buffer 212g as shown in FIG. 4A, or alternatively, master clock generator 212 may include a set of such buffers for distributing the master clock signal in parallel to the test instruments.

Clock source 230d may be implemented, for example, using a simple buffer or amplifier that generates one of the local clock signals LCSi so that it is substantially identical to the master clock signal after being delayed by an associated delay where this associated delay is determined in part by the propagation delay associated with the portion of the clock distribution network 216 between master clock generator 212 and the ith test instrument TINi as well as the propagation delays of modulator 212f, buffers 212g, 230a, demodulator 230b, and clock source 230d. Alternatively, clock source 230d may be implemented using a phase locked loop that uses the signal on line 230f as a frequency reference and generates one or more local clock signals LCSi so that they are characterized by frequencies that are related to the frequency of the master clock signal $f_{mc}$. In still other embodiments, clock source 230d may generate one or more local clock signals LCSi independently from the master clock signal, and in this case clock source 230d may be eliminated from the local clock receiver and located elsewhere within system 200. In yet other embodiments, clock source 230d may be eliminated from system 200 entirely so that each of the test instruments does not use any local clock signals.

In the embodiment shown in FIG. 4B, the clock distribution circuit 212c simply includes two buffers 212h, 212j, and the local clock receiver includes two buffers 230g, 230h in addition to counter 230c and clock source 230d. In the master clock generator 212, the master clock signal and the start signal are applied to buffers 212h and 212j, respectively, which generate therefrom output signals that are applied to a portion 216a and a portion 216b, respectively, of the clock distribution network 216. In the local clock receiver, buffer 230h receives a signal from portion 216b and generates therefrom an output signal that is applied to an enabling input of counter 230c. Buffer 230g receives a signal from portion 216a and generates therefrom an output signal that is applied to the clock input of counter 230c as well as to an input of clock source 230d. Counter 230c generates the local timestamp signal LTSSi, and clock source 230d generates the local clock signals LCSi. In this embodiment, rather than modulate the start signal onto the master clock signal (as was done in the embodiment shown in FIG. 4A) these signals are transmitted separately to the test instruments by different portions of the clock distribution network 216.

In the embodiment shown in FIG. 4C, the clock distribution circuit 212c includes a counter 212p, a buffer 212q and an m-bit buffer 212r, and the local clock receiver includes clock source 230d, buffer 230g, an m-bit buffer 230q, and a register 230p. In the master clock generator 212, the master clock signal is applied via line 212d to buffer 212q and to a clock input of counter 212p, and the start signal is applied via line 212e to an enabling input of counter 212p. Application of the start signal to counter 212p initializes counter 212p, and counter 212p then generates an m-bit master timestamp signal representative of the number of periods of the master clock signal $T_{mc}$ that have occurred following initialization, and this m-bit master timestamp signal is applied to buffer 212r. Buffers 212q and 212r generate output signals that are applied to portions 216a and 216b, respectively, of clock distribution network 216. Buffers 230g and 230q receive the signals transmitted by portions 216a and 216b, respectively. Buffer 230g generates an output signal that is applied to a clock input of register 230p and to clock source 230d which generates therefrom the local clock signals LCSi. Buffer 230q generates an m-bit output signal representative of the master timestamp signal that is applied to the data inputs of register 230p. Register 230p uses the clock signal provided by buffer 230g to sample the output signal provided by buffer 230q and thereby generates the local timestamp signal LTSSi. In this embodiment, the local start time $t_0i$ is the time at which register 230p samples the first output signal following initialization of counter 212p. So in this embodiment, rather than including a counter in every local clock receiver (as was done in the embodiments shown in FIGS. 4A and 4B) only a single counter 212p is used and it is included in the master clock generator 212, however in this embodiment, the portion 216b of the clock distribution network transmits an m-bit signal rather than a single bit signal.

In any embodiment of system 200 constructed according to the invention, the propagation delays between the master clock generator 212 and one of the test instruments may be different than the propagation delays between the master clock generator 212 and another of the test instruments. In this case, there may be timing offsets between the local initial times $t_0i$ of the various test instruments and therefore there may also be timing offsets between the local timestamp signals. However, since all the local timestamp signals are generated in response to a single master clock signal, the timing offsets between local timestamp signals remain substantially constant over time, and therefore, as will be discussed in greater detail below, overall synchronization of system 200 may still be maintained. Preferably, the propagation delays for signals transmitted via clock distribution network 216 from the master clock generator 212 to any one of the test instruments (e.g., the master clock signal and the start signal for the embodiment illustrated in FIG. 4B) are substantially equal so that at the test instrument there is no ambiguity about which transition of the master clock signal marks the initial time $t_0$.

The ith local timestamp signal LTSSi may be thought of as defining a time reference frame, or time frame, of the ith test instrument, for all i from one to n. The time frame of any one test instrument may be offset with respect to the time frame of another test instrument (as may be caused for example by different propagation delays between the master clock generator and these two test instruments). However, since all the local timestamp signals (and therefore all of the time frames) LTSS1–LTSSn are generated in response to the single master clock signal (or in response to signals generated therefrom), such timing offsets are constant in system 200, whereas in the prior art, such as in the system disclosed in the Edison Patent, such timing offsets are variable and tend to drift over time.

Figure 5:
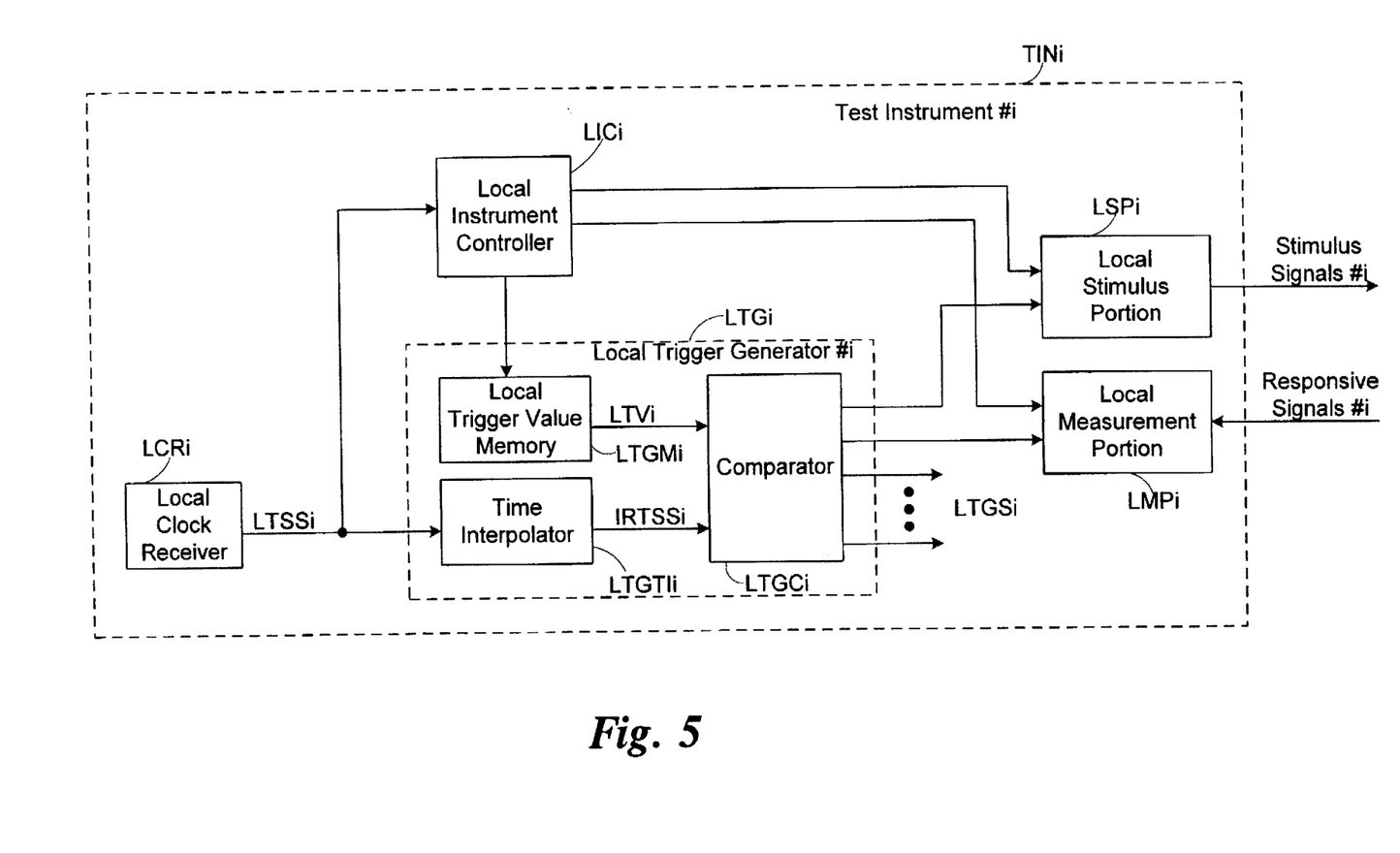
FIG. 5 shows a block diagram of one of the test instruments shown in FIG. 3 showing the local trigger generator in detail.

FIG. 5 shows a block diagram of the ith test instrument TINi used in system 200 showing the local trigger generator LTGi in detail. FIG. 5 also shows the test instrument TINi as including a local stimulus portion LSPi and a local measurement portion LMPi. In this illustrated embodiment, the local trigger generator LTGi includes a memory unit LTGMi, a time interpolator LTGTIi, and a comparator LTGCi.

The local clock receiver LCRi generates the local time stamp signal LTSSi and applies this signal to the time interpolator LTGTIi in the local trigger generator and to the local instrument controller LICi. The local instrument controller LICi generates control signals that are applied to the memory unit LTGMi in the local trigger generator and to the local stimulus and memory portions LSPi, LMPi. Within the local trigger generator LTGi, the memory unit LTGMi generates a local trigger value signal LTVi and applies this signal to the comparator LTGCi, and the time interpolator LTGTIi generates an improved resolution local timestamp signal IRTSSi and applies this signal to the comparator. As will be discussed below, in alternative embodiments, the time interpolator LTGTIi may be eliminated from the local trigger generator LTGi, in which case the local timestamp signal LTSSi generated by the local clock receiver is applied directly to the comparator LTGCi. The comparator generates one or more local trigger signals LTGSi. One or more of the local trigger signals LTGSi are applied to the local stimulus portion LSPi and one or more local trigger signals LTGSi are applied to the local measurement portion LMPi. The local stimulus portion LSPi generates one or more stimulus signals that are applied to the DUT (not shown) and the local measurement portion LMPi receives one or more responsive signals generated by the DUT.

Referring to FIGS. 3 and 5, in operation of system 200 the local instrument controller in each test instrument may be configured for particular operations by test controller 210 or by other devices in system 200. Once configured, the local instrument controller LICi in the ith test instrument stores one or more preselected values, referred to as "local trigger values" in the memory unit LTGMi of the local trigger generator LTGi. The memory unit LTGMi in turn generates local trigger value signals LTVi representative of the local trigger values and applies these signals to the comparator LTGCi. The comparator LTGCi monitors the local timestamp signal LTSSi (or as will be discussed in greater detail below, the improved resolution local timestamp signal IRTSSi) and generates an appropriate local trigger signal LTGSi whenever the local timestamp signal LTSSi equals one of the local trigger values. The local trigger signals LTGSi, in combination with an appropriate control signal from the local instrument controller LICi, cause other devices (such as devices in the local stimulus portion LSPi or the local measurement portion LMPi) in the test instrument TINi to initiate some form of action. For example, a device in the local stimulus portion of the test instrument may generate and apply a stimulus signal to the DUT 102 in response to receiving one of the local trigger signals, or another of the local trigger signals may cause a device in the local measurement portion of the test instrument to measure one of the responsive signals generated by the DUT 102.

A local trigger signal LTGSi may cause test instrument TINi to initiate a single action or a sequence of actions. So for example, a device in the local stimulus portion of test instrument TINi may generate, in response to a single local trigger signal, a time-varying stimulus signal that varies according to a preselected function of time (or a preselected function of the local timestamp signal LTSSi). Such a time-varying stimulus signal may include, for example, a series of pulses occurring at preselected times.

The mechanism of using a single local trigger signal to initiate a sequence of actions within a test instrument may be referred to as "stored sequences" and is partially analogous to the stored states mechanism discussed above. Whereas a system using stored states may easily configure a test instrument to a particular state, system 200 using stored sequences may easily cause one of the test instruments TIN1–TINn to transition through a sequence of time-varying states all in response to a single local trigger signal. The stored sequences may be stored, for example, in the local instrument controllers.

So test system 200 may test a complex DUT simply by pre-configuring each of the test instruments TIN1–TINn with the appropriate stored states, stored sequences, and local trigger values, and by then generating a start signal and thereby defining an initial time to that marks the start of testing. Following generation of the start signal, each of the test instruments performs each of its particular actions at fixed times relative to the initial time $t_0$. After the master clock generator 212 generates a start signal, each test instrument internally generates all local trigger signals needed to execute its specified tests. In this case, no action by test controller 210 is required between the time the start signal is generated and the last action is performed by any test instrument.

In this type of operation each of the test instruments operates independently from all of the other test instruments. Since each test instrument performs all of its particular actions at fixed times relative to the initial time $t_0$, the test system 200 tests the DUT 102 in a coordinated fashion. This type of operation is analogous to an orchestra playing a symphony. Each player is given a copy of his or her part. The conductor tells the players when to start, and defines the rhythm (like the master clock generator). Even though each player only knows his or her own part, the orchestra as a whole creates a symphony. In this analogy, each test instrument is analogous to a single player in the orchestra. Each test instrument performs its various tasks with no knowledge of what the other test instruments are doing, however, since each test instrument performs its actions at the proper times, as determined by the values of its local timestamp signal, the test instruments work together collectively in a coordinated fashion to test the DUT 102. Since each of the test instruments uses the master clock signal (or signals generated therefrom) to generate its local timestamp signal, the test instruments do not suffer from accumulated timing errors as do prior art systems such as the one disclosed in the Edison Patent.

As stated above, the local timestamp signals are m-bit signals. m is preferably chosen large enough so that two raised to the mth power is larger than the number of periods $T_{mc}$ of the master clock signal used to execute the test programs so that the local timestamp signals may have a unique value for every period of the test.

As stated above, each of the local trigger generators may include a time interpolator, a device which accurately measures time in terms of a fraction of a single clock period. When the ith local trigger generator LTGi includes a time interpolator, the time interpolator LTGTIi generates the improved resolution local timestamp signal IRTSSi, and the comparator LTGCi generates an appropriate local trigger signal whenever the improved resolution local timestamp signal IRTSSi equals one of the local trigger values LTVi. The output signal, IRTSSi, may be either a digital or continuous analog signal.

The improved resolution local timestamp signal includes a most significant portion and a least significant portion. The most significant portion (e.g., the most significant bits of the improved resolution local timestamp signal) is substantially identical to the local timestamp signal LTSSi, and the least significant portion (e.g., the least significant bits of the improved resolution local timestamp signal) is representative of fractional increments of the local timestamp signal LTSSi. For example, if the least significant portion is a binary three bit signal, then the time interpolator LTGTIi divides the time period between each increment of the local timestamp signal LTSSi into eight (i.e., two raised to the third power) sub-intervals, and increments the least significant portion once during each sub-interval so that each increment of the improved resolution local timestamp signal IRTSSi represents one-eighth of an increment of the local timestamp signal LTSSi (or the passage of one-eighth of a period $T_{mc}$ of the master clock signal). The time interpolator thereby enhances the timing resolution with which the local trigger generators can generate the local trigger signals (e.g., a local trigger signal may be generated at a time that falls in the middle of a single period of the master clock signal).

The time interpolator LTGTIi may be implemented using a phase locked loop to generate a signal having a higher frequency than that of the master clock signal and using this signal to divide the local timestamp signal into equal sized time segments. Alternatively, the time interpolators may be implemented using delay lines or other delay devices, or they may be implemented using an interpolator of the type disclosed in the above-referenced U.S. patent application No. 08/633,021, entitled Improved Differential Time Interpolator, or an interpolator of the type disclosed in U.S. Pat. No. 5,311,486, entitled Timing Generation in an Automatic Electrical Test System, which is assigned to the present assignee.

The operation of system 200 may be further enhanced by measuring the time offset between the time frame of the DUT 102 and the local time frame of each test instrument, and by adjusting the operation of each test instrument based on its time offset. The time frame of each test instrument is defined by that instrument's local timestamp signal (or by that instrument's local start time $t_0i$), and the time frame of the DUT 102 may be defined, for example, by a timestamp or clock signal of the DUT. Several calibration strategies have been used for performing time calibration of prior art test systems. One method of computing the time offset is to generate a calibration signal at the DUT at a known time $t_{known}$ in the time frame of the DUT and to apply this calibration signal to the local measurement portion of one of the test instruments. That test instrument then records the time of arrival, $t_{arrival}$, of the calibration signal by recording the value of the local timestamp signal when the calibration signal arrives, and the difference between $t_{known}$ and $t_{arrival}$ provides a measure of the time offset. This process may of course be repeated for all devices in the measurement portion of the test instrument to calibrate different functions of the test instrument. Similarly, the stimulus portion of a test instrument may be calibrated by generating a calibration signal at a known time in the time frame of the test instrument and applying this signal to the DUT and measuring the time of arrival of the calibration signal at the DUT in the time frame of the DUT.

Once the time offsets between the test instruments and the DUT have been determined, system 200 may generate a set of calibration coefficients for each test instrument that characterizes the relationship between each test instrument's time frame and the time frame of the DUT. Each test instrument may store its calibration coefficients, for example, in its local instrument controller. The local instrument controllers may then use these calibration coefficients to compensate for any time offsets by adjusting the local trigger values stored in the local trigger generators. For example, if test controller 210 instructs one of the local instrument controllers to apply a particular stimulus signal to the DUT at a time "z" as measured in the time frame of the DUT, the local instrument controller may use the calibration coefficients to determine that an appropriate local trigger signal should be generated at time "z" in the time frame of the test instrument so that the stimulus signal will be generated early and will arrive at the DUT at time "z". The local instrument controller would then store "z" as a local trigger value in the local trigger generator. System 200 may use the calibration coefficients to compensate for propagation delays between the test instruments and the DUT, as well as timing skews, or offsets, between timestamp signals on different test instruments and the DUT.

When calibration coefficients are used in this manner, system 200 is able to synchronously test the DUT in the time frame of the DUT without the use of instrument specific timing signals as was required in the prior art. System 200 may perform such synchronous testing even though the local timestamp signals used in the various test instruments may not be synchronized (as may be caused for example by variations in the propagation delays between the master clock generator 212 and the test instruments). Whereas in the prior art, the test control computer (such as computer 110 shown in FIG. 1) distributed instrument specific timing signals to each test instrument, in system 200 the test controller 210 need not have knowledge of the timing offsets between the test instruments and the DUT. Rather, the test controller 210 instructs the test instruments to perform actions (e.g., generate stimulus signals or measure responsive signals) at specific times in the time frame of the DUT, and each test instrument uses its own calibration coefficients to adjust these instructions to account for its own timing offsets with respect to the DUT. System 200 therefore precisely controls the timing, in the time frame of the DUT, of stimulus signals applied to the DUT and of measurements of responsive signals generated by the DUT, without the use of test instrument specific timing signals.

Figure 6:
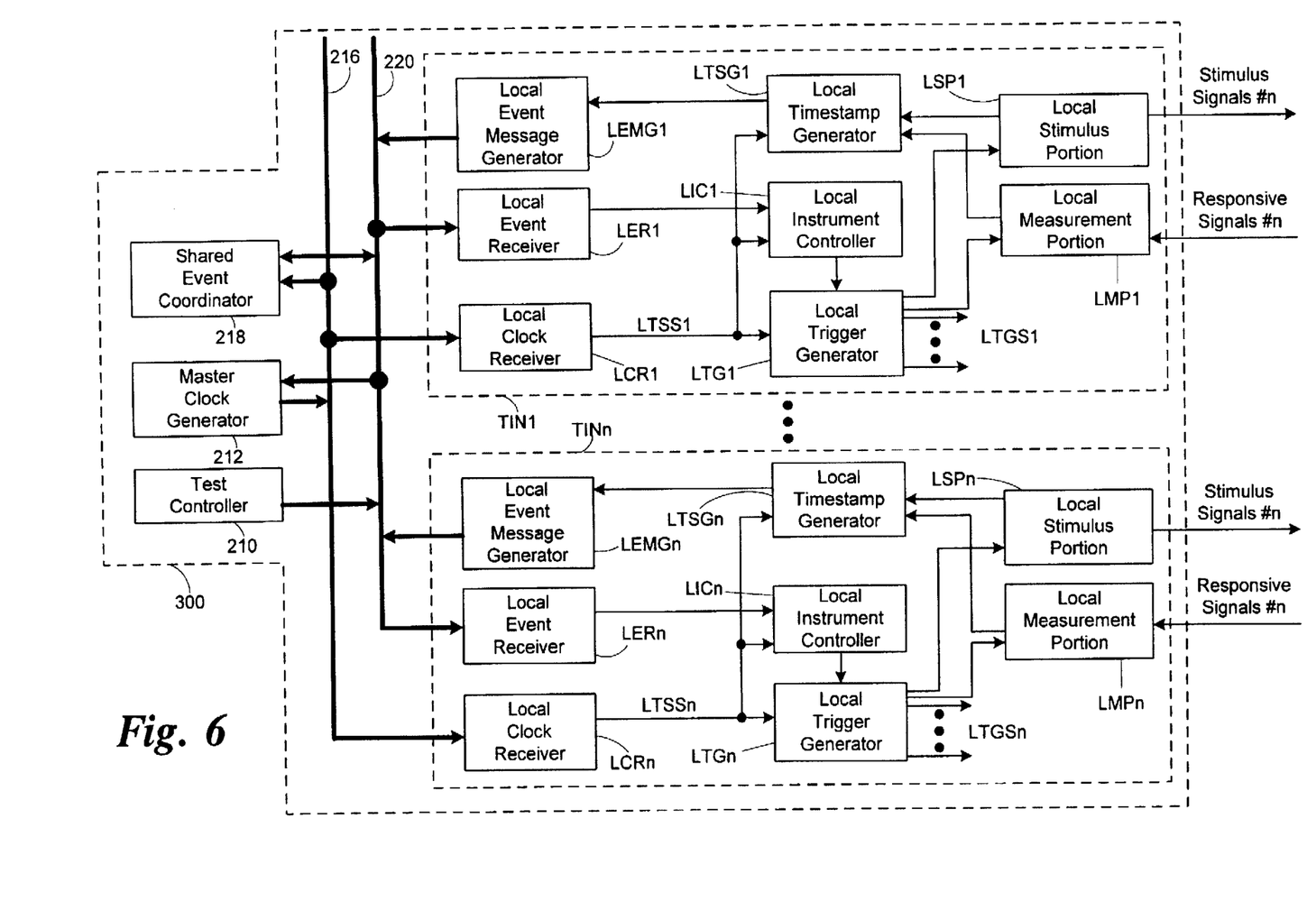
FIG. 6 shows a block diagram of a preferred embodiment of a test system constructed according to the invention.

FIG. 6 shows a block diagram of a preferred test system 300 constructed according to the invention. As with system 200 (shown in FIG. 3), system 300 includes test controller 210, master clock generator 212, and a set of n test instruments TIN1–TINn, although the test instruments used in system 300 are more complex than those discussed in connection with system 200. System 300 further includes a shared event coordinator 218 and an event message network 220. Master clock generator 212 distributes the master clock signal and the start signal (or signals generated therefrom) via clock distribution network 216 to all the test instruments TIN1–TINn and to shared event coordinator 218. All of the test instruments TIN1–TINn, shared event coordinator 218, master clock generator 212, and test controller 210 are coupled to event message network 220. All of the test instruments TIN1–TINn are coupled to a DUT (not shown) for applying stimulus signals to the DUT and for receiving responsive signals generated by the DUT.

An ith one of the test instruments TINi includes local clock receiver LCRi, local trigger generator LTGi, local instrument controller LICi, local stimulus portion LSPi, local measurement portion LMPi, as well as a local event receiver LERi, a local event message generator LEMGi, and a local timestamp generator LTSGi, for all i from one to n. The local clock receiver LCRi is coupled to the clock distribution network 216 and generates the local timestamp signal LTSSi. The local timestamp signal LTSSi is applied to the local trigger generator LTGi (which may generate therefrom an improved resolution local timestamp signal as discussed in connection with FIG. 5), the local instrument controller LICi, and to the local timestamp generator LTSGi. The local event receiver LERi receives messages from the event message network 220 and generates therefrom an output signal that is applied to the local instrument controller LICi. The local instrument controller LICi generates a control signal that is applied to the local trigger generator LTGi. The local instrument controller also generates control signals (which for convenience are not shown in FIG. 6) that are applied to the local stimulus portion LSPi and the local measurement portion LMPi. The local trigger generator LTGi generates a set of local trigger signals LTGSi, one or more of which may be applied to the local stimulus portion LSPi, and one or more of which may be applied to the local measurement portion LMPi. The local stimulus portion LSPi generates stimulus signals that are applied to the DUT (not shown) and the local measurement portion LMPi receives responsive signals generated by the DUT. Both of the local stimulus and measurement portions LSPi, LMPi generate output signals that are applied to the local timestamp generator LTSGi, which in turn generates an output signal that is applied to the local event message generator LEMGi. The local event message generator LEMGi generates event messages that are applied to other test instruments and the shared event coordinator 218 via the event message network 220.

Event message network 220 may be implemented using any medium suitable for transmitting messages such as, for example, wire, wireless, cable, printed circuit, optical, fiber optic, infrared, and waveguide mediums. Further, event message network 220 may be implemented as a serial or a parallel data transmission network, and network 220 may be implemented using any of the known network topologies such as for example, star, ring and bus topologies. Event message network 220 may be a homogeneous or a non-homogeneous network.

In operation, system 300 may function in a manner that is similar to the above-described operation of system 200. That is, system 300 may function in a mode in which each of the test instruments operates independently from all the other test instruments and each of the test instruments performs all of its particular functions at fixed times relative to the start of testing at time $t_0$. However, system 300 may additionally operate in a mode in which one or more of the test instruments perform actions in response to event messages received via the event message network 220 from the other test instruments or from the shared event coordinator. As will be discussed in greater detail below, allowing the test instruments to operate in response to event messages allows test system 300 to alter the tests applied to the DUT in response to events that occur during the testing process.

To facilitate this mode of operation, event message network 220 transmits event messages between the test instruments and the shared event coordinator 218. Any occurrence of significance in test system 300 or the DUT may be considered as an "event". For example, an initial "power up" of the DUT may be defined by system 300 as a "power up event", or when a test instrument determines that the DUT has generated a responsive signal that matches a particular desired pattern, the test instrument may declare that a particular "measurement event" has occurred.

In preferred modes of operation of system 300, each event message transmitted by event message network 220 indicates that a particular event has occurred. Each event message preferably includes an event component that indicates which event has occurred, and a timestamp component that indicates when the event occurred. Each event message may also include additional components that indicate particular features or parameters of the event (e.g., a voltage or a current level of a responsive signal).

In operation, one of the test instruments may be configured to observe the occurrence of a particular event and to inform other test instruments when that particular event occurs. For example, if the ith test instrument TINi is configured to monitor a particular measurement event, say event "x", then the local measurement portion LMPi observes the DUT at preselected scheduled times to determine whether event x has occurred. When the local measurement portion LMPi detects the occurrence of event x then the local measurement portion LMPi applies an output signal to the local timestamp generator LTSGi and thereby indicates to the local timestamp generator LSTGi that event x has occurred. In response to this output signal, the local timestamp generator LTSGi generates a timestamp by recording, or "capturing", the current value of the local timestamp signal LTSSi. The local timestamp generator LTSGi then applies an output signal to the local event message generator LEMGi and thereby indicates to the local event message generator LEMGi that event x has occurred at a time that is represented by the recorded timestamp. The local event message generator LEMGi then generates an event message and applies this event message to the event message network 220. The event message preferably includes an event component stating that event x has occurred and a timestamp component indicative of the timestamp recorded by the local timestamp generator LTSGi. When calibration values are available, the timestamp in the event message may be corrected to reflect the event time in the frame of reference of the DUT.

Continuing this example, the jth test instrument TINj may be configured to perform a specific action (e.g., generate a particular stimulus signal) or set of actions in response to the occurrence of event x. When the local event receiver LERj in the jth test instrument TINj receives the event message indicating that event x has occurred, the local event receiver LERj applies an output signal to the local instrument controller LICj. The local instrument controller then stores one or more local trigger values in the local trigger generator LTGj so that the local trigger generator LTGj will generate local trigger signals at appropriate times so that the jth test instrument TINj may perform its specific actions in response to the occurrence of event x. The local instrument controller LICj may of course also apply appropriate control signals to the local stimulus portion or the local measurement portion so that these portions will respond appropriately when they receive the local trigger signals.

Those skilled in the art of computer design are familiar with "interrupt signals", and an event message may be thought of as being partially analogous to an interrupt signal. When a test instrument receives a particular event message, the local event receiver determines whether the test instrument should take any action in response to that event message. If the local event receiver determines that the test instrument should respond to that event message, then the local event receiver informs the local instrument controller of the presence of the event message. The local instrument controller then determines what actions the test instrument should perform in response to the event message and then adjusts the local trigger generator (and possibly the local stimulus and measurement portions) accordingly so that the appropriate local trigger signals will be generated at appropriate times, and so that these local trigger signals will cause the test instrument to perform the proper actions in response to the event message.

In response to an event message, a test instrument may simply generate additional actions (e.g., the test instrument may simply perform additional measurements) or alternatively, the test instrument may perform a set of actions that are totally different than the actions it would have performed in the absence of the event message. Allowing test instruments to respond to event messages in this fashion permits test system 300 to alter the tests applied to the DUT in response to events that occur during the testing process, and therefore permits test system 300 to effectively test complex DUTs.

In addition to altering its actions based on occurrence of a single event, it may also be desirable for a test instrument to be able to alter its actions based on the occurrence of a set of events. The shared event coordinator 218 may be configured to monitor the event messages propagating on the event message network 220 to determine whether a set or a sequence of events has occurred. Shared event coordinator 218 may be configured to respond to a sequence of events occurring in one or more predetermined orders, or alternatively shared event coordinator 218 may be configured to respond to a sequence of events regardless of the order in which they occur. Once shared event coordinator 218 detects that a particular sequence of events has occurred, shared event coordinator 218 generates and applies an appropriate event message to the event message network 220 indicating that the sequence of events has occurred. One or more test instruments may then respond to event messages generated by the shared event coordinator. This permits test system 300 to alter the tests applied to the DUT in response to a set or sequence of events that occurs during the testing process.

It may be preferable for the local timestamp generator to include a time interpolator of the type discussed above in connection with the local trigger generator, for generating an improved resolution timestamp signal within the timestamp generator and thereby enhancing the timing resolution of the timestamps recorded by the local timestamp generator and transmitted via event messages.

Test system 300 preferably uses calibration coefficients to adjust the timestamps generated by the local timestamp generators so that timestamps transmitted via event messages represent occurrence times in the time frame of the DUT. Whenever a test instrument transmits an event message, the transmitting test instrument first adjusts the timestamp component of the event message to compensate for any timing offsets between the transmitting test instrument and the DUT. Then, when a test instrument receives the event message, the timestamp component of the event message informs the receiving test instrument of the occurrence time of the event in the time frame of the DUT, and the receiving test instrument need not compensate for timing offsets between the DUT and the transmitting test instrument. The receiving instrument then determines when in the time frame of the DUT it should act (e.g., generate a stimulus signal) in response to the event message, and generates its local trigger values accordingly to account for any timing offsets between the DUT and the receiving test instrument (e.g., so that the receiving test instrument generates stimulus signals early so that they arrive at the DUT at the proper time in the time frame of the DUT).

In the preferred embodiment, each of the test instruments measures the time offsets between its time frame and the time frame of the DUT, and each of the test instruments has no knowledge of the time offsets between the time frame of the DUT and the other test instruments. Whenever a test instrument reports the occurrence time of an event (e.g., via an event message) it does so using the time frame of the DUT. All instructions sent to a test instrument (e.g., from the test controller 210 or another test instrument) are given in terms of the time frame of the DUT, and the test instrument acts accordingly to compensate for any timing offsets between its own time frame and that of the DUT. In this manner, all of the test instruments cooperate to test the DUT in a coordinated, synchronized, fashion.

System 300 may be operated in several different modes. For example, in an "immediate execution" mode, the time offsets between the DUT and the test instruments are not be measured, and the event messages do not include timestamps. In this mode, a test instrument responds to an event message at the earliest possible time after the arrival of the event message. Further, in this mode the system 300 does not compensate for any timing offsets between the DUT and the test instruments. The immediate execution mode does not take advantage of many of the capabilities of test system 300, however, this mode allows test functions to occur with minimum delay.

System 300 may also be operated in a "programmed delay" mode. In this mode the event messages include timestamp components, and a test instrument may delay generating an action in response to an event message by a programmed delay. For example, a local instrument controller may determine that it should not act in response to a particular event message until two seconds after the timestamp of that message. This mode permits event messages to be transmitted well in advance of the time an action is required in response to the event message. In variations of this mode, the timestamps of event messages may indicate the time that an event has occurred in the time frame of the DUT, or alternatively, the timestamps may indicate a time at which a test instrument receiving the event message should perform a specified action in response to an event. Those skilled in the art will appreciate that many other modes of operation for systems 200 and 300 are also possible.

It may be preferable for each of the test instruments in systems 200 and 300 to include a logging device for recording, or "logging", the actions performed by the test instruments as a test program executes. The logging device may be implemented as part of the local instrument controller in each test instrument, or alternatively may be implemented as a separate device. Since unforeseen circumstances sometimes cause a test program to behave differently than expected, such logging devices aid understanding the actual operation of a test program. Preferably, the logging device records every action of interest taken by its test instrument as well as a timestamp (i.e., the value of the local timestamp signal) representative of when the actions were taken. After execution of a test program is completed, the stored information in the logging device may be accessed and displayed so as to aid understanding of the test program execution. The recorded timestamps may also be adjusted using appropriate calibration coefficients (either prior to or after recording) so that the activities of the test instruments may be projected into the time frame of the DUT to show the interrelationships between activities in different test instruments.

Those skilled in the art will appreciate that there are many different ways to implement system 300. For example, for convenience of discussion, the test instruments were described as including a local event receiver. Those skilled in the art will appreciate that the local event receiver need not be implemented as a separate component and instead may be incorporated into the local instrument controller. The same is also true of other components such as the local clock receiver, the local event message generator, the local timestamp generator, the local trigger generator, the local stimulus portion and the local measurement portion. Further, the shared event coordinator 218 may be eliminated and each local event receiver may be programmed to respond to sequences or sets of event messages when appropriate. Still further, the test instruments have been described as using the local trigger generator to generate local trigger signals that then cause the test instruments to take specific actions. Those skilled in the art will appreciate that the local trigger signals as described herein refer generically to any signal that causes a test instrument to perform an action at a selected time (such as generating a stimulus signal), and the local trigger signals need not be generated by a local trigger generator. For example, in alternative embodiments the local timestamp signal may be applied directly to the local stimulus portion which may be configured to generate a local trigger signal when the local timestamp signal equals a preselected value. Further, a local trigger signal may itself be used as a stimulus signal or as a signal for controlling a measurement of a responsive signal. Also, each test instrument has been described as generating one or more stimulus signals and as measuring one or more responsive signals. Those skilled in the art will appreciate that some test instruments may not generate any stimulus signals and therefore need not include a local stimulus portion, and other test instruments may not measure any responsive signals and therefore need not include a local measurement portion.

Further, the invention has been described in connection with test systems in which all the test instruments are coupled to the clock distribution network for receiving the start and master clock signals, or signals generated therefrom, however, as stated above, those skilled in the art will appreciate that the invention embraces systems including additional test instruments that are not so coupled to the clock distribution network.

The present embodiments are therefore to be considered in all respects as illustrative and not restrictive, the scope of the invention being indicated by the appended claims rather than by the foregoing description, and all changes which come within the meaning and band of equivalency of the claims are therefore intended to be embraced therein.

What is claimed is:

1. A test system for testing a device under test (DUT), said system comprising:

A. a master clock generator for defining a start time $t_0$ and for generating a periodic master clock signal characterized by a master clock oscillation frequency $f_{mc}$ and a period $T_{mc}$ and for generating a clock network signal representative of said master clock signal and of said start time $t_0$; and B. a set of n test instruments TIN1, TIN2, ... TINn, where n is an integer, an ith one of said test instruments TINi including a local clock receiver LCRi for receiving said clock network signal and for defining therefrom a local start time $t_0 i$ and for generating therefrom a local timestamp signal LTSSi representative of a number of time intervals having a length substantially equal to said period $T_{mc}$ occurring after said local start time $t_0 i$, said ith test instrument including means for storing one or more local trigger values and including means for generating one or more local trigger signals LTGSi when said local timestamp signal LTSSi equals one or more of said local trigger values, for all i from one to n.

2. A system according to claim 1, wherein one or more of said test instruments includes means, responsive to one of said local trigger signals, for applying a stimulus signal to said DUT.

3. A system according to claim 1, wherein one or more of said test instruments includes means, responsive to one of said local trigger signals, for receiving a responsive signal from said DUT and for measuring said responsive signal.

4. A system according to claim 1, further comprising a clock distribution network for distributing said clock network signal to each of said test instruments.

5. A system according to claim 4, wherein said clock distribution network comprises a non-homogeneous medium.

6. A system according to claim 4, wherein said clock distribution network comprises a homogeneous medium.

7. A system according to claim 4, wherein said clock distribution network comprises a transmission medium coupled to said master clock generator and to one of said test instruments, said transmission medium being selected from the group consisting of wire, wireless, cable, printed circuit, optical, fiber optic, infrared, and waveguide type transmission mediums.

8. A system according to claim 1, wherein said master clock generator includes means for generating a start signal indicative of said start time $t_0$.

9. A system according to claim 8, wherein said master clock generator includes means for modulating said start signal onto said master clock and thereby generating a modulated signal, and wherein said clock network signal comprises said modulated signal.

10. A system according to claim 8, wherein said clock network signal includes said master clock signal and said start signal.

11. A system according to claim 8, wherein said master clock generator includes counter means for receiving said start signal and said master clock signal and for generating a master timestamp signal representative of a number of periods $T_{mc}$ of said master clock signal occurring after said start time $t_0$, and wherein said clock network signal comprises said master timestamp signal.

12. A system according to claim 1, wherein at least one of said test instruments includes a local event message generator for generating an event message in response to a particular event, said event message being representative of said particular event.

13. A system according to claim 12, wherein said event message is further representative of an occurrence time of said particular event.

14. A system according to claim 13, wherein said occurrence time is indicated by a sampled value of one of said local timestamp signals.

15. A system according to claim 12, wherein one or more of said test instruments includes a local event receiver for receiving said event message, said one or more of said test instruments further including means for generating one or more local trigger signals in response to said event message.

16. A system according to claim 15, further including an event message network for receiving said event message from said at least one of said test instrument and for transmitting said event message to others of said test instruments.

17. A system according to claim 16, wherein said event message network is homogeneous.

18. A system according to claim 16, wherein said event message network is non-homogeneous.

19. A system according to claim 16, wherein said event message network comprises a transmission medium being selected from the group consisting of wire, wireless, cable, printed circuit, optical, fiber optic, infrared, and waveguide type transmission mediums.

20. A system according to claim 12, further including a shared event coordinator for receiving event messages from said at least one of said test instruments and for detecting an occurrence of a predefined sequence of said event messages and for generating an event message in response to said sequence.

21. A system according to claim 1, wherein a jth one of said test instruments, TINJ, includes time interpolator means for receiving a jth one of said local timestamp signals, LTSSj, and for generating therefrom an improved resolution local timestamp signal IRTSSj, said improved resolution local timestamp signal IRTSSj having a most significant portion that is substantial equal to said local timestamp signal LTSSj, and said improved resolution local timestamp signal IRTSSj having a least significant portion that is representative of fractional increments of said local timestamp signal LTSSj, wherein j is an integer greater than or equal to one and less than or equal to n.

22. A system according to claim 21, wherein said jth test instrument TINj includes means for generating one or more of said local trigger signals LTGSj when said improved resolution local timestamp signal IRTSSj equals one or more of said local trigger values.

23. A system according to claim 1, wherein said DUT is characterized by a time reference frame and wherein one of said test instruments is characterized by a time reference frame that is defined by its local timestamp signal, said system further including means for measuring a time offset between said time reference frame of said DUT and said time reference frame of said one test instrument.

24. A system according to claim 23, wherein said local trigger values include offset components to compensate for said time offset between said time reference frame of said DUT and said time reference frame of said one test instrument.

25. A system according to claim 23, wherein said one test instrument includes a local event message generator for generating an event message in response to a particular event, said event message being representative of said particular event.

26. A system according to claim 25, wherein said event message is further representative of an occurrence time of said particular event.

27. A system according to claim 25, wherein said one test instrument includes means for sampling its local timestamp signal and generating a timestamp value when said one test instrument detects an occurrence of said particular event.

28. A system according to claim 27, wherein said event message includes said timestamp value.

29. A system according to claim 27, wherein said one test instrument includes means for generating an adjusted timestamp as a function of said timestamp value and of said time offset.

30. A system according to claim 29, wherein said event message includes said adjusted timestamp.

31. A system according to claim 1, further including logging means for recording said one or more trigger signals.

32. A system according to claim 24, wherein said logging means further includes means for recording selected portions of said local timestamp signals.

33. A system according to claim 1, further including additional test instruments that operate independently of said clock network signal.

* * * * *